United States Patent
Manasse et al.

(10) Patent No.: US 9,442,799 B2
(45) Date of Patent: Sep. 13, 2016

(54) EXTENDED LIFETIME MEMORY

(71) Applicant: Microsoft Corporation, Redmond, WA (US)

(72) Inventors: Mark Steven Manasse, San Francisco, CA (US); Sergey Yekhanin, Mountain View, CA (US); Parikshit S. Gopalan, Mountain View, CA (US); Karin Strauss, Seattle, WA (US); John D. Davis, San Francisco, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 40 days.

(21) Appl. No.: 14/315,553

(22) Filed: Jun. 26, 2014

(65) Prior Publication Data

US 2015/0378821 A1    Dec. 31, 2015

(51) Int. Cl.
*G11C 29/00* (2006.01)
*G06F 11/10* (2006.01)
*G06F 12/02* (2006.01)
*G11C 29/04* (2006.01)

(52) U.S. Cl.
CPC ....... *G06F 11/1076* (2013.01); *G06F 11/1048* (2013.01); *G06F 12/0246* (2013.01); *G11C 29/765* (2013.01); *G11C 2029/0411* (2013.01)

(58) Field of Classification Search
CPC ... G11C 16/28; G11C 16/3445; G11C 29/52; G11C 29/021; G11C 29/028; G11C 29/50; G11C 29/02; G11C 16/04; G11C 16/0483; G11C 11/5621; G06F 11/1076; G06F 11/1068; G06F 11/1008; G06F 11/1048; G06F 3/0619; G06F 3/0631; G06F 3/0679; G06F 11/1004
See application file for complete search history.

(56) References Cited

U.S. PATENT DOCUMENTS

| 5,406,565 | A |  | 4/1995 | MacDonald |
|---|---|---|---|---|
| 5,581,508 | A |  | 12/1996 | Sasaki et al. |
| 6,542,407 | B1 | * | 4/2003 | Chen ................ G11C 11/5621 365/185.03 |
| 7,313,721 | B2 | * | 12/2007 | Ashmore ............. G06F 11/004 714/6.32 |

(Continued)

OTHER PUBLICATIONS

Qureshi, M. K., "Pay-As-You-Go: Low-Overhead Hard-Error Correction for Phase Change Memories", In Proceedings of the 44th Annual IEEE/ACM International Symposium on Microarchitecture, Micro'11, Dec. 3, 2011, 11 pages.

Maddah, et. al., "Data Dependent Sparing to Manage Better-Than-Bad Blocks", In Computer Architecture Letters vol. 12, Issue 2, Jul. 2013, 4 pages.

Fan, et al., "Aegis: Partitioning Data Block for Efficient Recovery of Stuck-at-Faults in Phase Change Memory", In Proceedings of the 46th Annual IEEE/ACM International Symposium on Microarchitecture, Dec. 7, 2013, 12 pages.

Jacobvitz, et al., "Coset Coding to Extend the Lifetime of Memory", In Proceedings of 19th IEEE International Symposium on High Performance Computer Architecture, Feb. 23, 2013, 12 pages.

(Continued)

*Primary Examiner* — Guerrier Merant
(74) *Attorney, Agent, or Firm* — Gregg Wisdom; Judy Yee; Micky Minhas

(57) ABSTRACT

A memory controller can include an error correction module for extended lifetime memory that tracks at least one sized block of non-fault consecutive bits within the disabled page as spare blocks and reuses the spare blocks from the disabled pages as an error correction resource for active blocks. The active blocks can store code data, data and metadata, or metadata only (e.g., error correction metadata). A method for extended lifetime memory can include, for an active block of metadata containing at least one fault, using at least one spare block to correct the data of the active block. For an active block of data containing at least one fault, the data can be initially corrected via XOR correction with a first spare block and then ultimately corrected via XOR correction with a second spare block.

20 Claims, 6 Drawing Sheets

(56) References Cited

U.S. PATENT DOCUMENTS

| | | | |
|---|---|---|---|
| 8,281,227 B2 | 10/2012 | Thatcher et al. | |
| 8,301,977 B2 | 10/2012 | Jagasivmani et al. | |
| 9,003,144 B1* | 4/2015 | Hayes | G06F 3/065 711/103 |
| 2008/0077840 A1 | 3/2008 | Shaw et al. | |
| 2009/0113259 A1* | 4/2009 | Aritome | G11C 16/28 714/721 |
| 2011/0041005 A1 | 2/2011 | Selinger | |
| 2013/0268822 A1* | 10/2013 | Manoochehri | G06F 11/1064 714/758 |
| 2014/0281814 A1* | 9/2014 | Vogan | G06F 11/1008 714/766 |
| 2015/0074487 A1* | 3/2015 | Patapoutian | G06F 11/1012 714/758 |
| 2015/0331749 A1* | 11/2015 | O'Connor | G06F 11/1076 714/764 |
| 2015/0339187 A1* | 11/2015 | Sharon | G11C 29/52 714/766 |

OTHER PUBLICATIONS

Azevedo, et al., "Zombie Memory: Extending Memory Lifetime by Reviving Dead Blocks", In Proceeding of the 40th International Symposium on Computer Architecture, Jun. 23, 2013, 12 Pages.

"International Search Report & Written Opinion Received for PCT Application No. PCT/US2015/037298", Mailed Date: Oct. 30, 2015, 8 Pages.

Second Written Opinion Issued in PCT Application No. PCT/US2015/037298, Mailed Date: Jun. 22, 2016, 4 Pages.

* cited by examiner

EXTENDED LIFETIME MEMORY

BACKGROUND

The memory used by a processor to read and write data has a finite lifetime. Memory wear-out, permanent errors generating "stuck-at" bits, and transient errors from bits that inappropriately flip states can plague memory devices. In general, memory errors fall within one of two categories of errors. The first type of error is a hard error, which occurs due to a physical defect or other anomaly that corrupts bits in a repeatable manner. The second type of error is a soft error, which refers to non-permanent errors such as those caused by electromagnetic radiation.

Error detection and error correction schemes may be incorporated in computing systems at various levels to insulate software and data stored on memory devices from experiencing the errors occurring at the physical memory.

BRIEF SUMMARY

Memory controllers and error correction techniques for extended lifetime memory are described.

A memory controller can include an error correction module that tracks at least one sized block of non-fault consecutive bits within the disabled page as spare blocks and reuses the spare blocks from the disabled pages as an error correction resource. The error correction module can further apply a correction code to an active block of data using at least one of the spare blocks. The correction code can be XOR correction. In some cases, two or more consecutive spare blocks can be applied to the active block to generate a corrected block. The active block of data may be data only, a combination of data and metadata, and metadata only.

A method for extended lifetime memory can include, for an active block containing at least one fault, reading a first spare set of bits from a spare cell of a disabled memory page, applying an error correction code to the active block using the first spare set of bits to obtain an initially corrected set of bits, and if the initially corrected set of bits continue to contain at least one fault, applying the error correction code to the initially corrected set of bits using a second spare set of bits from a second spare cell. The first spare cell and the second spare cell can be located at consecutive address locations, as indicated by a table managed by a memory controller.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Memory controllers and error correction techniques for extended lifetime memory are described.

Figure 1:
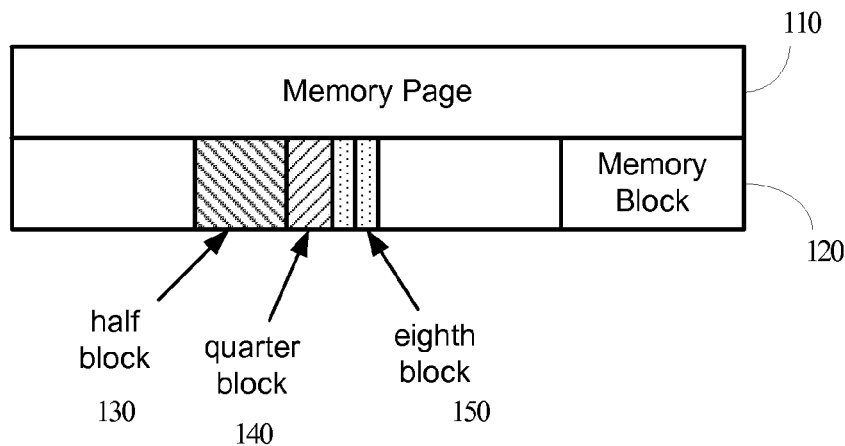
FIG. 1 illustrates an available granularity of a memory unit.

FIG. 1 illustrates an available granularity of a memory unit. In general, an operating system interacts with memory at a granularity of a page 110. A "page" 110 is also the term commonly used to refer to the size of the blocks in which data is written or read. The size of a page may depend on implementation and the underlying memory device and/or memory controller. A memory page 110 may be formed of multiple blocks 120 that can be individually addressed. These blocks 120 can even include subblocks of fixed sizes, for example a half block 130, a quarter block 140, or even an eighth of a block 150 may be accessible internally or externally. A block 120 of memory in a cache or even in main memory, is often referred to as a line. Each line can include a number of bits for metadata.

Each page, block, or subblock can include bits that are used for data and bits that are used for providing error correction. These error correction bits may be interleaved with the data bits or provided as a separate page, a separate one or more blocks (or subblocks), or even from a separate chip. For many memory modules, a current trend is to either have eight memory device chips for data and one memory device chip for error correction or have extra bits available for error correction at each of the eight chips.

Figure 2:
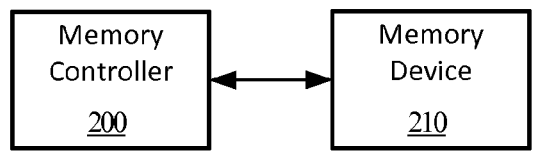
FIG. 2 illustrates a basic block diagram of a memory system.

FIG. 2 illustrates a basic block diagram of a memory system for extended lifetime memory. Referring to FIG. 2, a memory system can include a memory controller 200 for one or more memory devices 210. The memory controller 200 can control overall input/output operations of the memory device 210. In some cases, the memory device 210 may be a memory chip (a single chip or multiple chips on a memory module, board or other package either with or separate from the memory controller 200). In some cases, the memory device 210 may be memory that is embedded on a same chip with the memory controller 200. In some cases, the memory device 210 (and the memory controller 200) may be embedded with one or more processors as a system-on-chip (SOC) on a same chip and/or stacked as part of a three dimensional (3D) integrated circuit (IC).

The memory device may be formed of any suitable memory technology. Although specific implementations are described herein for phase change memory (PCM), other memory technologies and even dynamic random access memory (DRAM) technologies may incorporate the described techniques. The memory can be PCM, conductive bridging memory (e.g., programmable metallization cell (PMC)), and other non-volatile memory. In some cases, DRAM (e.g., double data rate synchronous dynamic random access memory (DDR SDRAM)) may be used.

Figure 3:
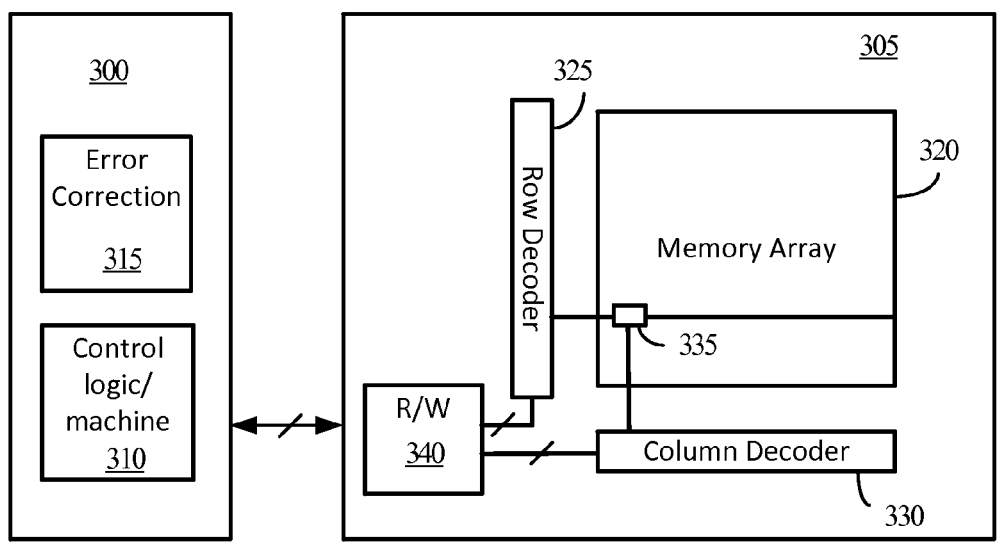
FIG. 3 illustrates a non-limiting example detailed view of a memory system providing extended lifetime memory.

FIG. 3 illustrates a non-limiting example detailed view of a memory system providing extended lifetime memory. Referring to FIG. 3, the memory system can include a memory controller 300 and a memory device 305. The memory controller 300 can include control logic and machines 310 used to control the memory device 305, providing the requests for reading and writing data stored at the memory device 305. The control logic and machines 310 may include logic elements and registers (storage). Arbitration can be carried out by an arbiter of the control logic and machines 310, which chooses the order in which requests access memory. Static memory controllers generally have a predesigned schedule; whereas dynamic memory controllers may schedule requests in run time. An error correction module 315 can be included to facilitate extended lifetime memory for the memory device 300. Although most of the techniques described herein are carried out at the memory controller, in some cases, some of the error correction techniques may be available on-chip with the memory. Some on-chip error correction may be controlled by the memory controller. Some on-chip error correction may be transparent to the memory controller.

The memory device 305, for example in the form of a memory chip, can have multiple arrays of data. For example, memory device 305 may include a memory cell array 320 arranged in rows and columns. Data stored in the memory device 305 can be read from the memory array 320 into a row buffer (not shown). From the row buffer, at least a portion of the data can be sent to the memory controller 300 to service a request.

The particular row of the array can be selected by a row select command (which is also referred to as an activate command) from the memory controller 305 and one or more columns of data from the row can be selected by a column select command from the memory controller 305, providing the data to the row buffer. A row decoder 325 and a column decoder 330 can be used to select particular cell(s) 335 based on a row select/activation command signal and a column select command signal. A read/write unit 340 can provide the logic and state machines used to read from and write to the memory array 320. Some error correction techniques may be available as part of the read/write unit 340 as well as any control layers for other capabilities built into the memory device that are hidden from the memory controller 300.

As memory degrades, it becomes harder and harder to find a sufficient number of spare bits with which to perform error correction techniques. In some error correction schemes, each memory unit (whether a page, block, subblock, cell or other designation) has specifically allocated error correction resources. One example of such an error correction scheme involves error correction pointers (ECP) such as described by S. Schecter et al., "Use ECP, not ECC, for hard failures in resistive memories," in Proceedings of the 37$^{th}$ Annual International Symposium on Computer Architecture, June 2010.

In some error correction schemes, it may be possible to share resources and allocate more error correction resources to the memory units that have relatively more failures. One example of such an error correction scheme involves a Pay-As-You-Go architecture such as described by M. K. Qureshi, "Pay-As-You-Go: Low-Overhead Hard-Error Correction for Phase Change Memories," In Proceedings of the 44th Annual IEEE/ACM International Symposium on Microarchitecture, December 2011. In both types of schemes there still remain a finite number of resources that can be used for error correction.

Sometimes, once a single line, block, cell or other unit in a page of memory has exhausted its error correction resources, the full page of memory may be disabled (becomes unavailable for software use). Some error correction schemes can take advantage of this otherwise non-active page to supply additional error correction resources to the active (non-disabled) pages and further increase the lifetime of a memory device. One such technique is referred to as Zombie memory.

Not only is the lifetime of a memory device limited by the amount of memory available for error correction (and how that error correction is allocated to each line or memory unit), but what is not always appreciated by some error correction schemes is that the memory used by those error correction schemes can also wear out in a manner that can adversely affect device lifetime. This effect can be most notable as a higher number of consecutive bits are needed to be used to correct an active page or line of memory. For example, as the memory system experiences failures, the memory that an error correction scheme uses to correct errors is likely to contain failed locations or cells. This can result in system failure, in some schemes, when the error rate exceeds 5%. Being able to extend the lifetime of memory so that system failure can be postponed even when the error rate reaches 10%, 15% or more can increase the chances that a particular memory will be adopted for a computing system.

Intrinsic error correction resources refer to those resources (e.g., bits) a priori designated for error correction, whether provided locally or for global sharing. For example, some error correction schemes can incorporate error correction pointers. Error correction pointers (ECP) involve the use of replacement cells and pointers to the failed cells the replacement cells replace. ECP can correct a failed bit in a memory line by recording the position of the bit in the line and its correct value. For example, a 64 byte (512 bit) line uses a 9-bit pointer and a 1-bit replacement bit (total of 10 bits) for each ECP entry.

In many memory error correction schemes, once a page of memory contains a block that runs out of intrinsic error correction resources, the entire page is disabled and made unavailable to software. The techniques described herein can use these disabled pages to generate at least a fully functional block (or subblock) and, in some cases, even a fully functional page.

One or more blocks (or even subblocks), sourced from disabled pages, can be used with an active block to extend the active block's useful lifetime. An active block refers to the active blocks of the software-visible pages as well as the a priori designated error correction regions (whether provided as part of each block or subblock or in a separate region of physical memory). The intrinsic error correction resources that are not software-visible (e.g., the error correction resources for Pay-As-You-Go, described later) are included in the definition of an active block.

Figure 4:
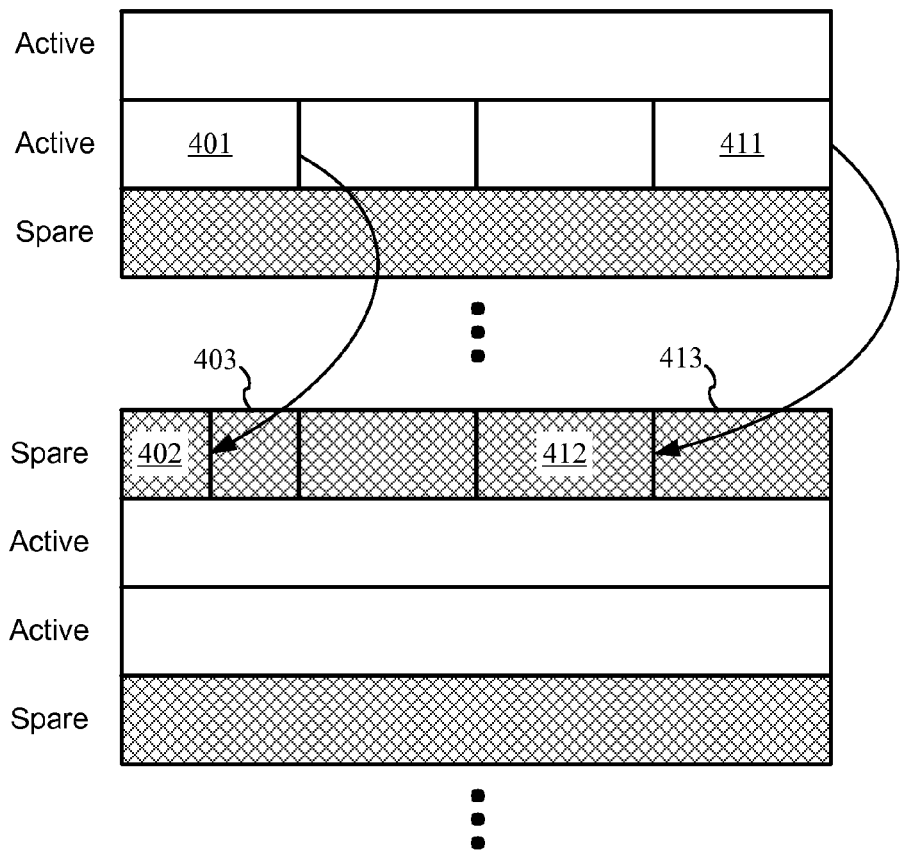
FIG. 4 illustrates one technique in which spare memory pages are used to extend error correction resources.

FIG. 4 illustrates one technique in which spare memory pages are used to extend error correction resources. An active block 401 that may be running out of error correction resources can have its lifetime extended through using at least one spare subblock 402 sourced from a disabled page. Spare blocks can be formed of any designated sizes. In one implementation, three sizes may be used, the largest being a full block (e.g., 512-bits). The first spare subblock 402 may contain errors, and so a second spare subblock 403 may be used to correct the errors with the first spare subblock. As another example, an active block 411 that may be running out of error correction resources can have its lifetime extended through use of one or more spare blocks 412 sourced from a disabled page. For example, the active block 411 may be corrected using the spare block 412 and, if an error still remains at the active block 411, another correction may be performed using another spare block 413.

When the block is divided into subblocks, the memory controller records which subblocks have been allocated and which are free, either in the spare block itself or in a separate table. In some implementations, each spare block size may have its own address pool. The memory controller can keep track of the pools. The memory controller can keep a separate pool for each subblock size. Pools can be a head entry pointing to block linked-lists implemented using the storage in the blocks themselves. The memory controller's control path and error correction modules (see e.g., 310, 315 of FIG. 3) can share and communicate spare block contents through a spare data buffer.

In addition, the memory controller can allocate spare subblocks for on-demand use. In some cases, spare blocks of differing sizes may be used based on the particular error correction scheme being applied and the number of stuck-at errors of the active block (whether the active block contains data or the error correction metadata). As part of an extended lifetime memory technique, spare cells (in pages, blocks, and/or subblocks) can be used to correct active cells.

The ECP metadata in an active block can include a field to indicate whether all entries are used. A two-bit field can be included to indicate that the block does not have a corresponding at least one spare block or the size of the subblock/block in use. The remaining ECP bits can be used to redundantly store the spare block address and additional metadata.

In one implementation, the memory controller's control path module can locate a spare block associated with the active block by following the pointer stored in the active block. In another implementation, the memory controller can locate a spare block associated with the active block using a table. When a block is read, the memory controller places the spare block data into the spare data buffer. When a block is written, the memory controller copies the contents of the spare data buffer to the spare block.

Figure 5:
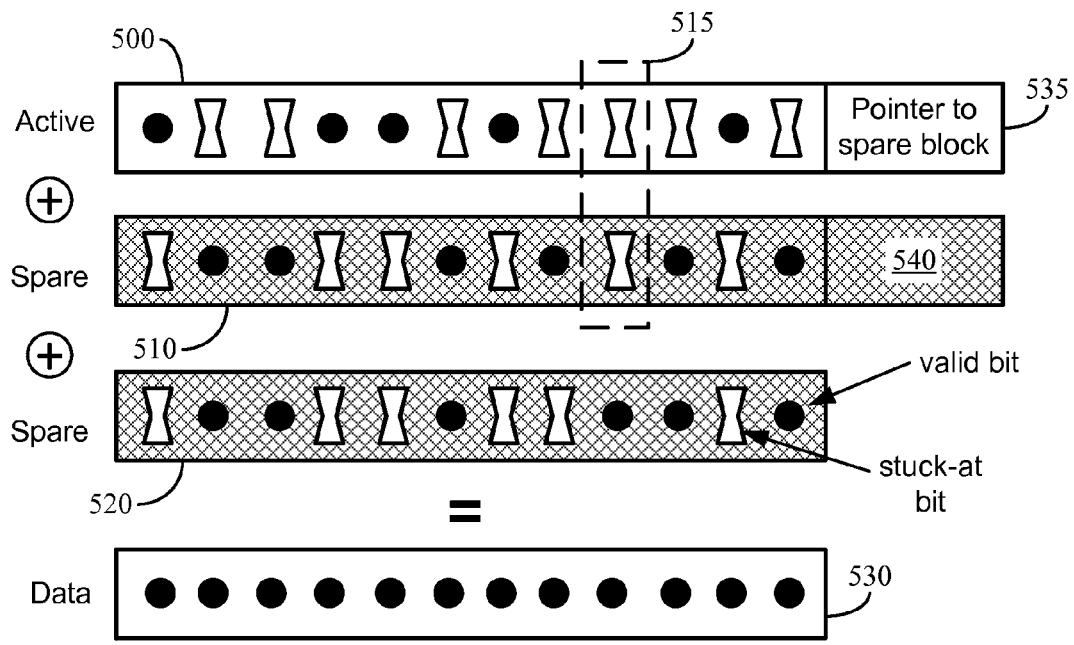
FIG. 5 illustrates extended lifetime memory through XOR correction.

FIG. 5 illustrates extended lifetime memory through XOR correction. The XOR correction (or bit-wise multiplication) may be controlled by the error correction module 315 of FIG. 3 (e.g., with a bit-wise XOR unit) as one example. Referring to FIG. 5, an XOR-based encoding can be used to read and write to blocks of memory. If a cell in an active block 500 is stuck, its counterpart in a spare block 510 can be used to recover the original value stored in the cell. If that counterpart cell in the spare block 510 is also stuck, such as shown in section 515, a second spare block 520 can be used to generate the original data 530. Metadata bits 535 at the active block 500 can include a pointer to the first spare block 510.

In one implementation, the spare blocks are accessed consecutively so that the next available spare block is used to recover the original value for the active block. In another implementation, a pointer (and corresponding bits 540 in the spare block 510) can be used to indicate the next spare block with which to perform the XOR coding.

The spare block is selected to the same size as the active block. A cell of data can be the XOR of cells with the same offset in active and spare blocks. To read a block, at least the active block and a first spare block are read from memory. The original data is obtained by performing a bit-wise XOR of these values read from the first spare block and the active block. A bit-wise XOR can further be performed using a second spare block (and in some cases a third or fourth or more depending on overhead considerations and optimizations). At least two blocks from main memory are read. However, reads of the active block and at least the first spare block can proceed in parallel if the information indicating the first spare block to use (not the data) is cached by the memory controller and the blocks have been mapped to independent banks.

For a write operation, the memory controller can determine what values are to be written to the active block and spare blocks. The goal is to write values P' (for the active block) and S', S", etc. (for the spare block(s)) such that P'⊕S'⊕S" encode the desired data. To reduce wear, the memory controller can write mostly to the spare blocks and only write to the active blocks the bits that, when XORed with corresponding spare block stuck-at bits, recover the desired data bit. This approach can lengthen the active block's lifetime at the expense of the spare block's lifetime. If the active block cannot be corrected using the designated number of spare blocks for combining via XOR, the page to which the active block belongs can be disabled, and its blocks are added to the spare pool.

Figure 6:
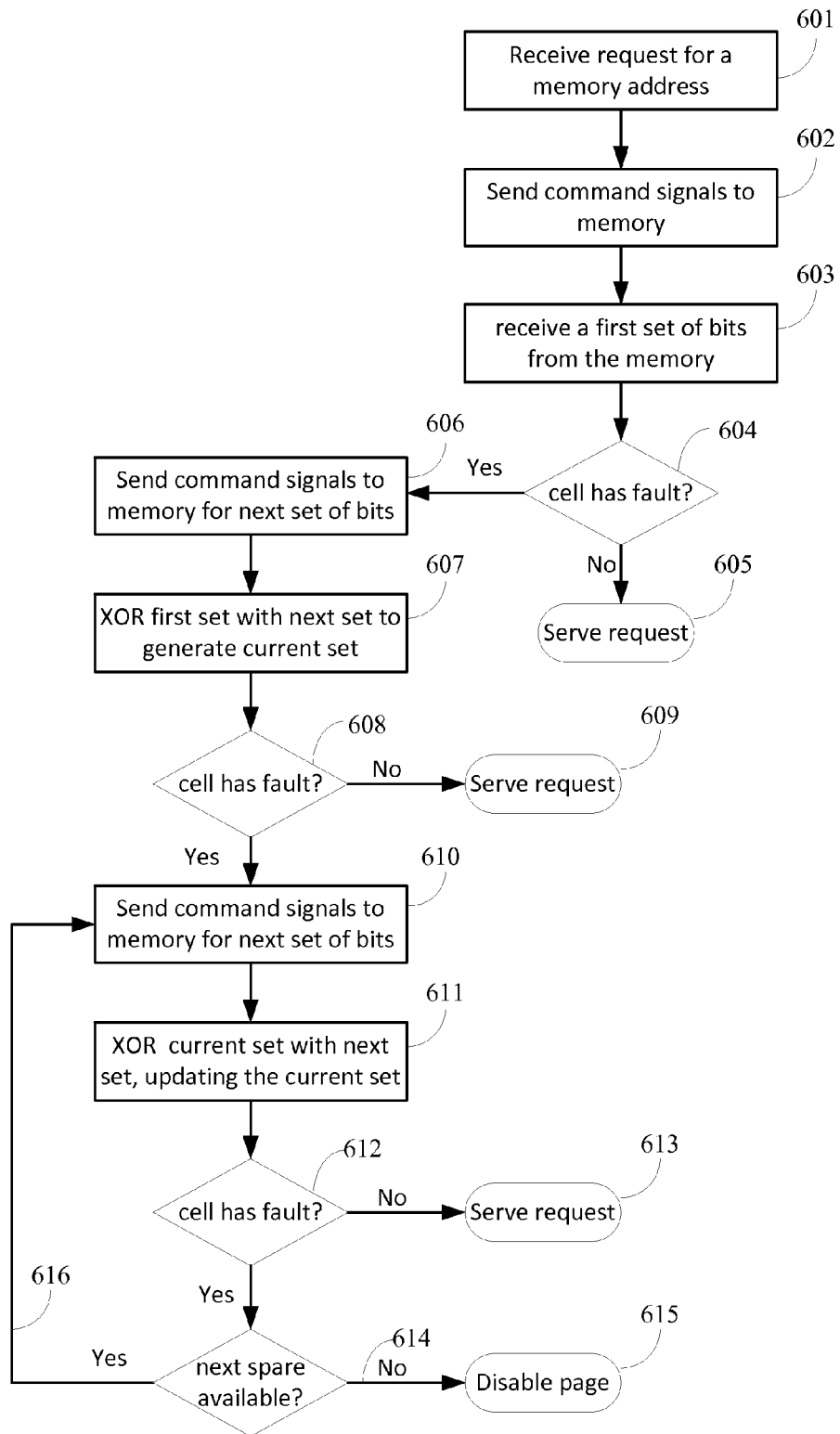
FIG. 6 illustrates a process flow for applying an error correction code using XOR and consecutive memory locations.

FIG. 6 illustrates a process flow for applying an error correction code using XOR and consecutive memory locations. Referring to FIG. 6, a memory controller may receive a request for a memory address (601). The request may be a read request or a write request. In some cases, a write request involves reading data from memory before writing to the memory. Accordingly, while the process flow illustrated in FIG. 6 is primarily focused on a read request, certain aspects of this process flow may be carried out for a write request as well.

Upon receiving a request for the memory address, the memory controller can generate command signals (602) to a memory coupled to the memory controller to cause a set of bits to be buffered for reading. The buffered bits can be read from the memory so that the memory controller receives a first set of bits from the memory (603). The first set of bits can correspond to a first memory address. The memory controller can determine whether the cell of the first set of bits contains a fault (604). In some cases, the fault determination can be made based on a flag of one or more bits read from the cell. In some cases, the fault determination can be made based on a table look-up.

If there is no fault with the first set of bits, then the memory controller can serve the request (605) and perform subsequent processes to accomplish the task. If there is a fault with the first set of bits, the memory controller can generate command signals (606) to the memory to cause a next set of bits from a memory page (or block or subblock) designated as a spare to be buffered for reading. The buffered bits can be read from the memory so that the memory controller receives the next set of bits from the memory and the first set of bits XORed with the next set of bits to generate a current set of bits (607). The next set of bits from the memory can be checked for errors before performing the XOR operation.

In some cases, the memory controller may determine whether the cell has a fault before sending the command signals to the memory (e.g., at the time the request for a particular memory address is received). In one such case, the memory controller can send commands to the memory so that both the first set of bits and at least a next set of bits are retrieved serially or in parallel.

The memory controller can determine whether the current set of bits contains a fault (608). If there is no fault with the current set of bits, then the memory controller can serve the request (609) and perform subsequent processes to accomplish the task. If there is a fault with the current set of bits, the memory controller can generate command signals (610) to the memory to cause a next consecutive set of bits from a next available (or consecutive) memory page (or block or subblock) designated as a spare to be buffered for reading. The buffered bits can be read from the memory so that the memory controller receives the next set of bits from the memory and the current set of bits are XORed with the next set of bits to update the current set of bits (611). The next consecutive set of bits from the memory can be checked for errors before performing the XOR operation. The memory controller can determine whether the current set of bits contains a fault (612). If there is no fault with the current set of bits, then the memory controller can serve the request (613) and perform subsequent processes to accomplish the task.

At this time two XOR operations have been performed using two sets of data from spare blocks. In some cases there are no further spare blocks associated with the data from the original active block providing the first set of bits. Thus, if there are no further blocks of data and XOR operations to be performed (614), the memory controller can indicate that the page of data associated with the first memory address is disabled (615). The memory controller can manage a table that tracks at least one sized block (e.g., a full block and/or one or more subblocks) of non-fault consecutive bits within the disabled page as spare blocks.

For the case where a third (or more) XOR operation is arranged to be capable of being carried out (616), the memory controller can repeat operations 610 and 611 to either be able to provide corrected data (e.g., as part of serving the request in operation 613) or to determine that the page should be disabled (e.g., operation 615). The operations illustrated in FIG. 6 may be carried out for data bits and/or metadata bits to generate fully operational pages of data. The operations illustrated in FIG. 6 may also be carried out on only a portion of the bits read from the memory, for example, as described in more detail below, the memory controller can perform the XOR correction using spare pages on error correction data alone (i.e., correcting the correction data).

Figure 7:
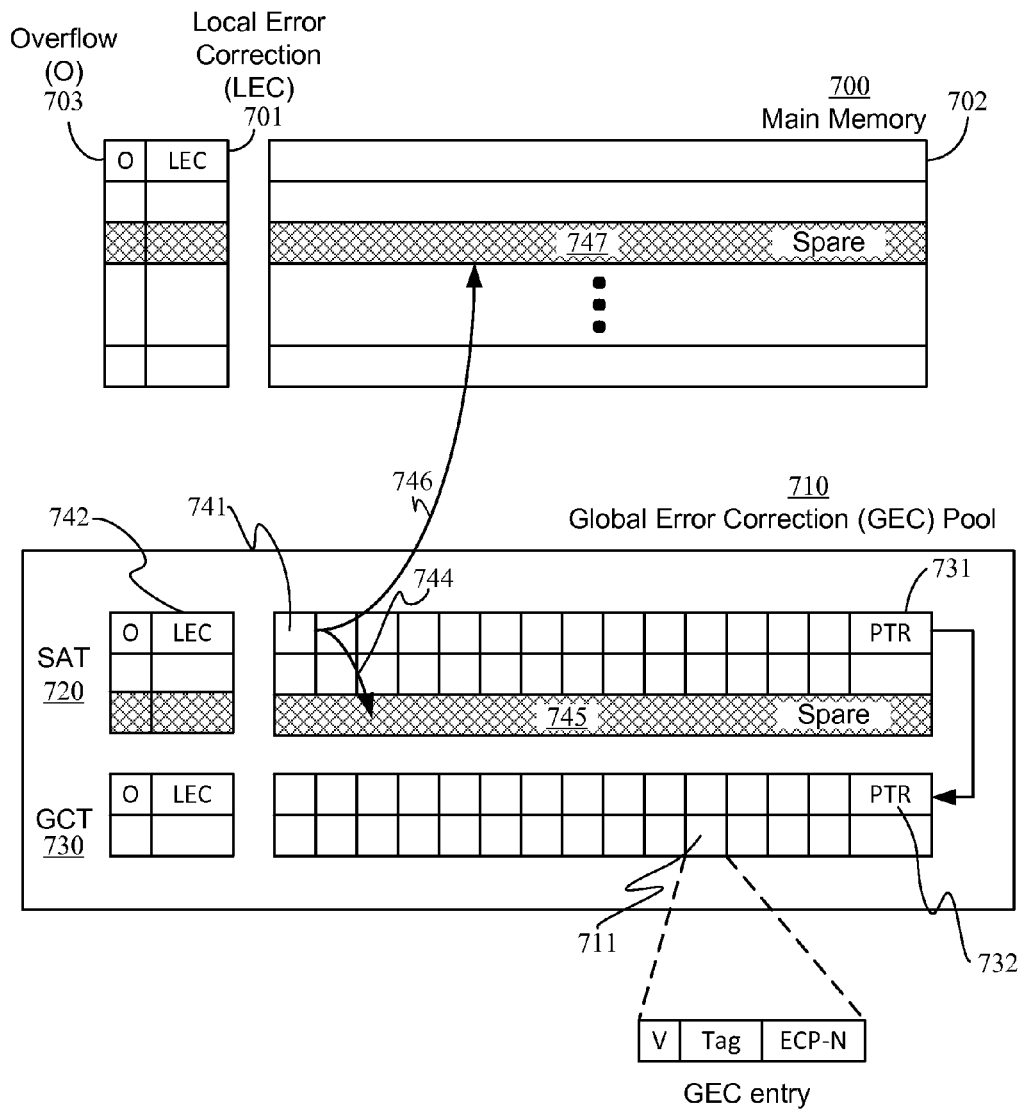
FIG. 7 illustrates a Pay-As-You-Go (PAYG) architecture incorporating extended lifetime memory.

FIG. 7 illustrates a Pay-As-You-Go (PAYG) architecture incorporating extended lifetime memory. In the PAYG architecture, a local error correction (LEC) 701 can be allocated with each line 702 of memory 700. When the number of errors in a line (e.g., line 702) exceed what can be corrected by the LEC 701, an overflow bit (OFB) 703 associated with that line can be set and an entry 711 from a global error correction (GEC) pool 710 can be allocated for the line (e.g., line 702). In one implementation, LEC 701 can provide ECP-1 to correct up to 1 error per line. The GEC pool 710 can provide error correction entries for lines that have more errors than can be handled by their corresponding LEC 701. Each GEC entry 711 contains a valid bit, a tag (to identify the owner line), and one or more ECP entries (or other error correction scheme such as an alternate data retry, line sparing, and the like). For an ECP implementation, each GEC entry 711 can provide any one of ECP-1, ECP-2, . . . , ECP-5 as examples. ECP-1 results in a size of 20 bits in each GEC entry 711. The GEC pool 710 can be accessed in numerous ways. One organization for the GEC pool uses a hash-table-with-chaining structure.

The hash-table-with-chaining structure can involve two tables: the set associative table (SAT) 720 and the Global collision table (GCT) 730. The SAT 720 provides a single-index low-latency access to the GEC Pool 710 and GCT 730 provides flexibility in placement. Both tables may be structurally identical. A GEC set can include a pointer (PTR) 731 that points to a location in the GCT 730.

For reading (obtaining) a GEC entry, SAT 720 is accessed first in a set that is indexed by some bits of the line address. If there is no tag match in the set, then the PTR 731 of that set identifies the GCT 730 set that will be checked. If there is a tag match in the GCT row, then GEC entries can be obtained. If there is no match, the PTR 732 in that set identifies the next GCT set that must be checked. The traversal continues until a GCT entry with matching tag (or a set with OFB=0) is found.

For allocating GEC entries, initially, the GCT sets remain unallocated. These sets get allocated to a set of SAT only on overflow. To aid this allocation, a register may be used to keep track of the number of GCT entries that have been allocated. When one of the set of SAT overflows, the PTR of that set is initialized to the value at the register and the OFB associated with that set is set to 1. The newly allocated set of GCT provides as many GEC entries as the associativity of GCT. The PTR of this newly allocated entry is marked invalid and OFB is set to 0 (to indicate end of traversal). The register is incremented after every GCT allocation. When the value of the register reaches the number of sets in GCT, it indicates an uncorrectable error.

The PAYG architecture uses statistical multiplexing to enable a relatively small amount of extended memory to be used to provide patches for errors occurring in a large memory. To extend the lifetime of memory using PAYG error correction architecture, error correction can be provided for the PAYG correction values. Spare cells can be applied to the 20 bit (or larger) GCT entries 711 to extend the lifetime of the memory. For example, the GEC entry 741 may optionally have a stuck at bit corrected through the LEC 742 for that line or set. However, once the error correction resources (if any) for the GEC entry 741 have been exhausted, spare cells from spare blocks (or subblocks) can be used to correct the error. In some cases (e.g., case 744), a spare block 745 from the GEC pool 710 may be used to correct GEC entry 741. In some cases (e.g., case 746), a spare block from main memory 700 may be used to correct the GEC entry 741.

The particular correction scheme using the spare blocks may vary depending on implementation. In one implementation, XOR correction, such as described with respect to FIG. 5, can be performed using at least one spare block (and in some cases two or more spare blocks may be used). The XOR approach finds blocks of memory where the true value is encoded by computing the exclusive-or of the two blocks, and picking blocks with at most six coincident errors. In some implementations, the XOR operations can be performed of adjacent (or aligned next block or two) correction locations. For example, 20 bits can be XORed with 20 bits from a spare block (and in some cases, the next block/subblock). The location of the spare block to be used can be stored in a table, encoded in the bits for the GEC entry, or made available by some other suitable technique.

By dedicating a portion of the memories to hold only correction data and using the spare blocks to correct the correction data, the write burden on the extended memory does not begin until after the error rate of main memory starts increasing, and address writes may happen only once.

In another implementation, erasure coding may be used to extend the PAYG error patches (the GEC entries) to contain a few extra bits of memory, allowing for a small number of erroneous bits in the patch block. The correction for multiple bits can be encoded in the extended memory provided by the spare blocks. For example, for a GEC entry using ECP-1, using 20 bits, one erasure coding technique codes the 20 bits into 25 bits allowing for any two of the bits to be stuck.

Erasure codes (ERC) are an example of codes to deal with stuck-at faults that use one-to-many encoding functions. The ERC approach extends small units of memory with correction bits which can be computed based on the location of a small number of stuck bits.

Multiple possible representations of the same message are used to ensure that at least one representation is appropriately aligned with the values of stuck cells and can actually be stored in memory. In addition, stuck-at bit locations can be stored. ERC include coding schemes that encode k-symbol messages to n-symbol codewords and tolerate d−1 stuck-at faults. To store k-bit messages in an n-bit memory block where up to d−1 cells are stuck, a binary k×n matrix G can be used. This matrix G is a generator matrix of a binary linear code of length n, dimension k, and distance d. The possible representations of x are all vectors y such that $G_y^T = x$. In some implementations, if more than one vector y is aligned with the values of stuck cells, the vector y that optimizes the memory lifetime (i.e., wears the spare block as opposed to the active block) is selected.

Each block can be divided into multiple data messages of size k and encoded into larger codewords of size n with an erasure code [n, k, d] that can tolerate up to d−1 errors. A higher tolerance for stuck-at cells is available because of the multiple codewords from which to find a compatible codeword (i.e., a codeword containing symbols that match the stuck-at cell values).

A hardware optimized implementation of this ERC involves (1) biasing writes toward the spare blocks, (2) adapting to a gradually higher number of failures by increasing the subblock size to accommodate more error tolerant encodings, and (3) calculating one-to-many mappings using a table-based implementation.

After encoding, the k first bits of each codeword are stored in the active subblock, and the remaining in the spare. Codewords are intentionally partitioned into active and spare blocks. The encodings can be biased so that bit flips are more frequent in the spare block as opposed to the active block. The biasing towards writing to the spare block can be done to preserve the active blocks because in this scheme a spare block can be readily replaced with another. As failures accrue, subblocks can grow, stretching to make space for more error tolerant encodings. For single level cell (SLC) PCM, 128-bit subblocks can be used to tolerate up to 2 errors per codeword, 256-bit subblocks can be used to tolerate up to 3 errors per codeword, and 512-bit blocks can be used for 3 errors per smaller codeword.

In some cases, a system of linear equations may be solved. Instead of implementing hardware to solve the system of linear equations dynamically, the blocks can be partitioned into smaller data messages, which reduces the size of matrices used for decoding and their inverses used for encoding. These smaller matrices can be pre-computed for every set of stuck-at cells and allow for a table-based implementation that removes the need to solve the system dynamically, resulting in a hardware-optimized design. For SLC PCM, 20-bit messages can be encoded into 25-bit codewords (128-bit subblocks, 2 errors per codeword), 10-bit messages can be encoded into 15-bit codewords (256-bit subblocks, 3 errors per codeword), and 4-bit messages can be encoded into 8-bit codewords (512-bit blocks, 3 errors per codeword).

A priori knowledge of stuck-at locations is used to encode the blocks. A naive approach to generating this knowledge is to flip all cells and read them back, comparing new to original values. However, performing this operation can cause too much wear on the write-sensitive PCM. Therefore, in some implementations, a failure location cache can be used that consists of entries that store a bit vector for error locations in both active and spare blocks.

According to various implementations, spare pages, blocks, and/or subblocks may be used to produce a fully working page of memory that can then be used for an arbitrary purpose. Some examples of purposes to which the fully working page may be applied include PAYG memory (e.g., the GEC pool), main memory, and error correction bits.

In some cases, the spare pages, blocks, and/or subblocks can be used for correction of specific blocks/subblocks as opposed to a full page.

Figure 8:
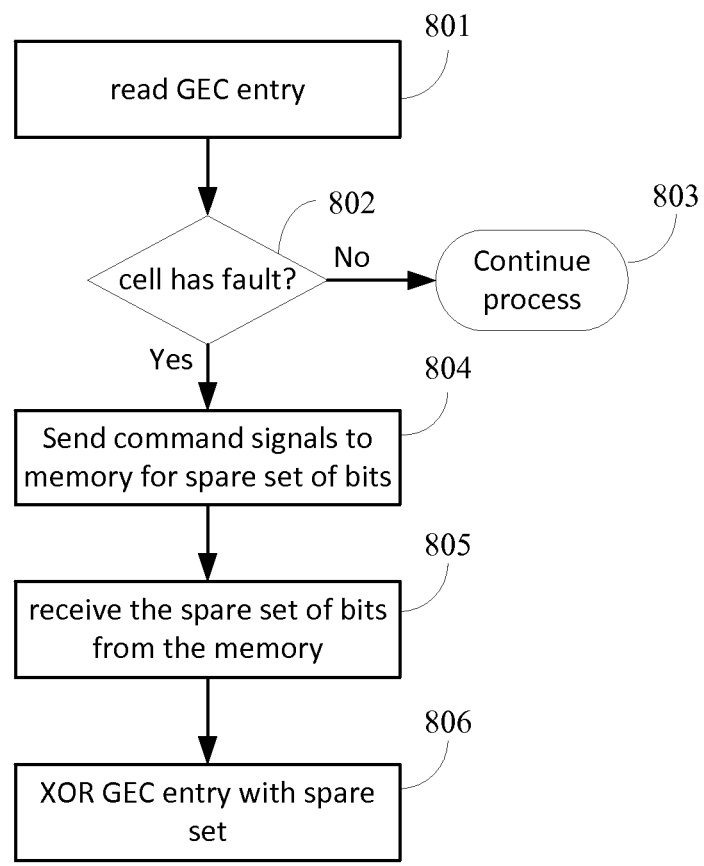
FIG. 8 illustrates a process flow for applying an error correction code to correction metadata.

FIG. 8 illustrates a process flow for applying an error correction code to correction metadata. Referring to FIG. 8, a GEC entry can be read (801), and a determination can be made as to whether the bits of the GEC entry contain a fault (802). If the bits do not indicate a fault, processes can continue for obtaining an error corrected data line using the GEC entry (803). Otherwise, the memory controller can send command signals to the memory for a spare set of bits (e.g., of the same size as the GEC entry) (804). The spare set of bits can be received from the memory (805), and the GEC entry can be XORed with the spare set (806). The spare set of bits can be checked for errors before the error correction code is applied.

Figure 9A:
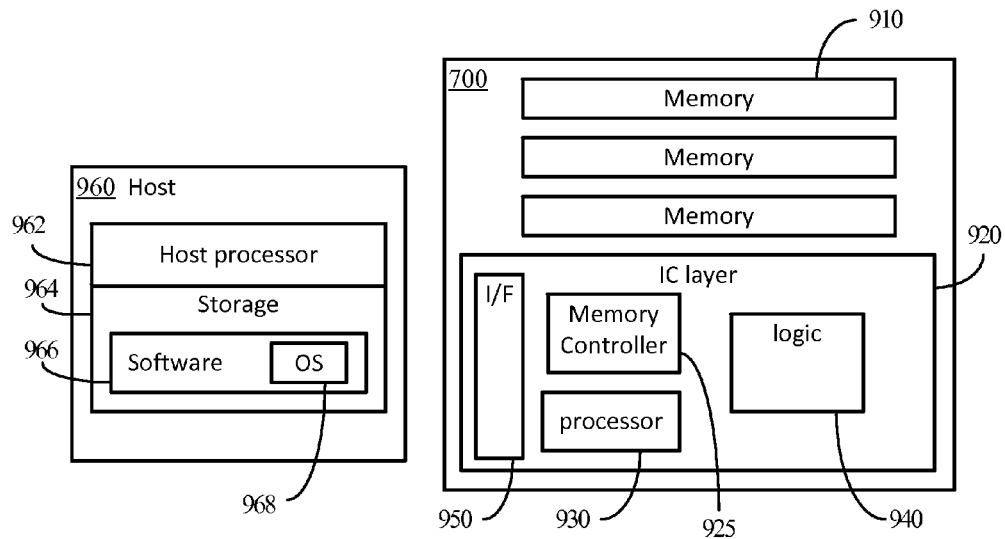
FIGS. 9A and 9B illustrate operating environments in which certain implementations of the variable width error correction may be carried out.
Figure 9B:
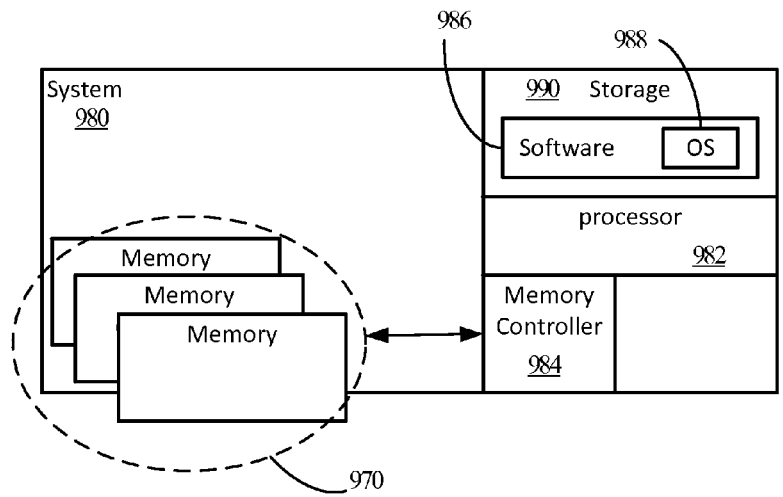

FIGS. 9A and 9B illustrate operating environments in which extended lifetime memory may be provided (and corresponding techniques carried out). FIG. 9A illustrates a system on a chip configuration in which an integrated circuit (IC) 900 is provided in a two-dimensional (2D) or three dimensional (3D) structure with on-chip memory. One example of a 3D IC arrangement is to have multiple stacks of memory 910 on an IC layer 920. A memory controller 925 can be included on the IC layer 920. The memory controller 925 may be a separate component or integrated with a processor 930 or microprocessor. As illustrated, a processor 930 and, optionally, other logic 940 may also be available on the IC layer 920.

An interface 950 may be included for transmitting and receiving signals external to the IC 900, for example, to communicate with peripheral components. In one scenario, the interface may be used to communicate with a host 960 having a host processor 962, storage system 964 storing software 966, including operating system 968. In another scenario, an operating system and other software can be stored in one or more of the stacks (or blocks) of memory 910.

FIG. 9B illustrates another non-limiting example configuration in which extended lifetime memory may be provided (and corresponding techniques carried out) for memory 970, for example in the form of memory modules of PCM or other resistive memory devices. The system 980 illustrated in FIG. 9B may be part of a distributed system that may include a group of functionally interchangeable servers or resources. The servers or resources can include various storage devices or systems. These resources may be taken on and off-line and additional resources may be added. The resources to which the system 980 forms a part may be located together in a same space, such as at a single data center, or they may be located individually and/or in clusters at different geographical locations. The system 980 can be suitable for use in high performance systems including those handling complex computations and/or those managing large systems such as servers handling cloud services and finance computation systems.

The system 980 may be implemented as server, which can include one or more computing devices. The server can include one or more blade server devices, standalone server devices, personal computers, routers, hubs, switches, bridges, firewall devices, intrusion detection devices, mainframe computers, network-attached storage devices, and other types of computing devices. The server hardware can be configured according to any suitable computer architectures such as a Symmetric Multi-Processing (SMP) architecture or a Non-Uniform Memory Access (NUMA) architecture.

The system 980 can include a processing system 982, which may include a processing device such as a central processing unit (CPU) or microprocessor and other circuitry that retrieves and executes software 986, including an operating system (OS) 988, from storage system 990. Processing system 982 may be implemented within a single processing device but may also be distributed across multiple processing devices or sub-systems that cooperate in executing program instructions.

Examples of processing system 982 include general purpose central processing units, application specific processors, and logic devices, as well as any other type of processing device, combinations, or variations thereof. The one or more processing devices may include multiprocessors or multi-core processors and may operate according to one or more suitable instruction sets including, but not limited to, a Reduced Instruction Set Computing (RISC) instruction set, a Complex Instruction Set Computing (CISC) instruction set, or a combination thereof. In certain embodiments, one or more digital signal processors (DSPs) may be included as part of the computer hardware of the system in place of or in addition to a general purpose CPU.

A memory controller 984, which may be integrated with or separate from processing system 982, can control overall input/output operations of the memory devices 970.

Storage system 990 may comprise any computer readable storage media readable by processing system 982 and capable of storing software 986. Storage system 990 may include volatile and nonvolatile, removable and non-removable media implemented in any method or technology for storage of information, such as computer readable instructions, data structures, program modules, or other data.

Examples of storage media include random access memory, read only memory, magnetic disks, optical disks, CDs, DVDs, flash memory, magnetic cassettes, magnetic tape, magnetic disk storage or other magnetic storage devices, or any other suitable storage media. Certain implementations may involve either or both virtual memory and non-virtual memory. In no case do storage media consist of a propagated signal. In addition to storage media, in some implementations storage system 990 may also include communication media over which software 986 may be communicated internally or externally.

Storage system 990 may be implemented as a single storage device but may also be implemented across multiple storage devices or sub-systems co-located or distributed relative to each other. Storage system 990 may include additional elements, such as a controller, capable of communicating with processing system 982.

Software 986 may include additional processes, programs, or components. Software 986 may also include firmware or some other form of machine-readable processing instructions executable by processing system 982.

System 980 may represent any computing system on which software 986 may be staged and from where software 986 may be distributed, transported, downloaded, or otherwise provided to yet another computing system for deployment and execution, or yet additional distribution.

Certain aspects of the invention provide the following non-limiting embodiments:

Example 1

A memory controller for extended lifetime memory, comprising: an error correction module that manages blocks of non-fault consecutive bits within a disabled page of a memory as spare blocks; and for an active block of the memory containing at least one fault, applies a correction code to the active block using at least one of the spare blocks.

Example 2

The memory controller according to example 1, wherein the correction code is an XOR correction and the error correction module applies the XOR correction such that the active block is XORed with a first spare block and a second spare block of the spare blocks.

Example 3

The memory controller according to example 2, wherein the second spare block is located at a next consecutive spare block address location from the first spare block in a spare block pool managed by the memory controller.

Example 4

The memory controller according to examples 2 or 3, wherein the active block is further XORed with a third spare block of the spare blocks.

Example 5

The memory controller according to example 1, wherein the correction code is an erasure code.

Example 6

The memory controller according to any of examples 1-5, wherein the memory is phase change memory.

Example 7

The memory controller according to any of examples 1-6, wherein the active block contains data and metadata.

Example 8

The memory controller according to any of examples 1-6, wherein the active block contains only metadata.

Example 9

The memory controller according to any of examples 1-8, wherein the active block comprises a page of the memory.

Example 10

A method for extended lifetime memory, the method comprising: for an active block containing at least one fault: reading a first spare set of bits from a spare block of a disabled memory page; applying an error correction code to the active block using the first spare set of bits to obtain an initially corrected set of bits; and if the initially corrected set of bits contain at least one fault, applying the error correction code to the initially corrected set of bits using a second spare set of bits from a second spare block to obtain an updated corrected set of bits.

Example 11

The method according to example 10, further comprising: if the updated corrected set of bits contain at least one fault, disabling a page of memory to which the active block belongs and tracking sections of the page as spare blocks.

Example 12

The method according to examples 10 or 11, wherein the second spare block is located at a next consecutive spare block address location from the first spare block.

Example 13

The method according to any of examples 10-12, wherein the correction code is an XOR correction.

Example 14

The method according to any of examples 10-13, wherein the active block comprises a memory page.

Example 15

The method according to any of examples 10-13, wherein the active block contains only metadata.

Example 16

The method of any of examples 10-15, further comprising: before applying the error correction code to the active block, determining any faults contained in the spare block; and before applying the error correction code to the initially corrected set of bits, determining any faults contained in the second spare block.

Example 17

The method of any of examples 10-16, further comprising: if the updated corrected set of bits contain at least one fault, applying the error correction code to the updated corrected set of bits using at least a third spare set of bits to obtain a corrected set of bits.

Example 18

A system comprising: a memory controller for extended lifetime memory; and one or more memory devices coupled to the memory controller, wherein the memory controller comprises an error correction module that manages blocks of non-fault consecutive bits within disabled pages of the one or more memory devices as spare blocks; and for an active block in any one of the one or more memory devices that contains at least one fault, applies a correction code to the active block using at least one of the spare blocks.

Example 19

The system according to example 18, herein the one or more memory devices comprise phase change memory.

Example 20

The system according to any of examples 18 or 19, wherein the active block comprises a global error correction (GEC) entry and the correction code is an XOR correction, wherein the memory controller is further configured to: read the GEC entry from a GEC pool for correcting a line of memory on any of the one or more memory devices; read at least one set of spare bits from the spare blocks; and perform the XOR correction with the GEC entry and the at least one set of spare bits.

Example 21

The system according to examples 18 or 19, wherein the correction code is an XOR correction.

Example 22

The system according to examples 18 or 19, wherein the correction code is an erasure code.

Example 23

The system according to any of examples 18-22, wherein the active block comprises a memory page.

It should be understood that the examples and embodiments described herein are for illustrative purposes only and that various modifications or changes in light thereof will be suggested to persons skilled in the art and are to be included within the spirit and purview of this application.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts that would be recognized by one skilled in the art are intended to be within the scope of the claims.

What is claimed is:

1. A memory controller for extended lifetime memory, comprising:
an error correction module that manages blocks of non-fault consecutive bits within a disabled page of a memory as spare blocks; and for an active block of the memory containing at least one fault, applies a correction code to the active block using at least one of the spare blocks,
wherein the disabled page is a page of the memory that has been made unavailable to software due to that page of the memory containing a block that has run out of intrinsic error correction resources.

2. The memory controller of claim 1, wherein the correction code is an XOR correction and the error correction module applies the XOR correction such that the active block is XORed with a first spare block and a second spare block of the spare blocks.

3. The memory controller of claim 2, wherein the second spare block is located at a next consecutive spare block address location from the first spare block in a spare block pool managed by the memory controller.

4. The memory controller of claim 2, wherein the active block is further XORed with a third spare block of the spare blocks.

5. The memory controller of claim 1, wherein the correction code is an erasure code.

6. The memory controller of claim 1, wherein the memory is phase change memory.

7. The memory controller of claim 1, wherein the active block contains data and metadata.

8. The memory controller of claim 1, wherein the active block contains only metadata.

9. The memory controller of claim 1, wherein the active block comprises a page of the memory.

10. A method for extended lifetime memory, the method comprising:
for an active block of memory containing at least one fault:
reading a first spare set of bits from a spare block of a disabled memory page, wherein the disabled page is a page of the memory that has been made unavailable to software due to that page of the memory containing a block that has run out of intrinsic error correction resources;
applying an error correction code to the active block using the first spare set of bits to obtain an initially corrected set of bits; and
if the initially corrected set of bits contain at least one fault, applying the error correction code to the initially corrected set of bits using a second spare set of bits from a second spare block to obtain an updated corrected set of bits.

11. The method of claim 10, further comprising:
if the updated corrected set of bits contain at least one fault, disabling a page of memory to which the active block belongs and tracking sections of the page as spare blocks.

12. The method of claim 10, wherein the second spare block is located at a next consecutive spare block address location from the first spare block.

13. The method of claim 10, wherein the correction code is an XOR correction.

14. The method of claim 10, further comprising:
before applying the error correction code to the active block, determining any faults contained in the spare block; and
before applying the error correction code to the initially corrected set of bits, determining any faults contained in the second spare block.

15. The method of claim 10, further comprising:
if the updated corrected set of bits contain at least one fault, applying the error correction code to the updated corrected set of bits using at least a third spare set of bits to obtain a corrected set of bits.

16. A system comprising:
a memory controller for extended lifetime memory; and
one or more memory devices coupled to the memory controller,
wherein the memory controller comprises an error correction module that manages blocks of bits within disabled pages of the one or more memory devices as spare blocks; and for an active block in any one of the one or more memory devices that contains at least one fault, applies a correction code to the active block using at least one of the spare blocks,
wherein the disabled pages are pages of the one or more memory devices that have been made unavailable to software due to that page containing a block that has run out of intrinsic error correction resources.

17. The system of claim 16, wherein the one or more memory devices comprise phase change memory.

18. The system of claim 16, wherein the active block comprises a global error correction (GEC) entry and the correction code is an XOR correction, wherein the memory controller is further configured to:
read the GEC entry from a GEC pool for correcting a line of memory on any of the one or more memory devices;
read at least one set of spare bits from the spare blocks; and
perform the XOR correction with the GEC entry and the at least one set of spare bits.

19. The system of claim 16, wherein the correction code is an XOR correction.

20. The system of claim 16, wherein the active block comprises a memory page.

* * * * *